(12) United States Patent
Mangal et al.

(10) Patent No.: US 11,050,457 B2
(45) Date of Patent: Jun. 29, 2021

(54) CIRCUITS FOR CONTINUOUS-TIME CLOCKLESS ANALOG CORRELATORS

(71) Applicants: Vivek Mangal, New York, NY (US); Peter R. Kinget, Summit, NJ (US)

(72) Inventors: Vivek Mangal, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 16/889,716

(22) Filed: Jun. 1, 2020

(65) Prior Publication Data

US 2020/0382154 A1    Dec. 3, 2020

Related U.S. Application Data

(60) Provisional application No. 62/855,853, filed on May 31, 2019.

(51) Int. Cl.
*H04B 1/00* (2006.01)
*H04B 1/709* (2011.01)
(Continued)

(52) U.S. Cl.
CPC ............ *H04B 1/709* (2013.01); *H03D 7/165* (2013.01); *H03M 1/468* (2013.01); *H03M 1/804* (2013.01)

(58) Field of Classification Search
CPC ......... H04B 1/709; H04B 1/707; H04L 7/033; H04L 7/0891; H03M 1/00; H03M 1/12; H03M 3/434; H03L 7/08; H03L 2207/06
(Continued)

(56) References Cited

U.S. PATENT DOCUMENTS 8,942,151 B2   1/2015   Anderson et al.
9,191,891 B2   11/2015  Jafarian et al.
(Continued)

OTHER PUBLICATIONS

Rekhi, A.S. et al., "A 14.5mm2 8nW-59.7dBm-sensitivity utrasonic wake-up receiver for power-, area-, and interferenceconstrained applications", in IEEE International Solid State Circuits Conference, Feb. 2018, pp. 454-456.
(Continued)

*Primary Examiner* — Khai Tran
(74) *Attorney, Agent, or Firm* — Byrne Poh LLP

(57) ABSTRACT

Circuits for continuous-time analog correlators are provided, comprising: a first VCO that receives an input signal and that outputs a first pulse frequency modulated (PFM) output signal; a second VCO that receives a reference signal and that outputs a second PFM output signal; a first phase frequency detector (PFD) that receives the first PFM output signal and the second PFM output signal and that produces a first PFD output signal; a first delay cell that receives the first PFM output signal and that produces a first delayed signal (DS); a second delay cell that receives the second PFM output signal and that produces a second DS; a second PFD that receives the first DS and the second DS and that produces a second PFD output signal; and a capacitor-digital-to-analog converter (capacitor-DAC) that receives the first PFD output signal and the second PFD output signal and that produces a correlator output.

18 Claims, 16 Drawing Sheets

(51) Int. Cl.
H03D 7/16 (2006.01)
H03M 1/80 (2006.01)
H03M 1/46 (2006.01)

(58) Field of Classification Search
USPC .................................. 375/150, 376; 330/109
See application file for complete search history.

(56) References Cited

U.S. PATENT DOCUMENTS

| | | | |
|---|---|---|---|
| 9,413,403 | B2 | 8/2016 | Wentzloff et al. |
| 9,413,578 | B2 | 8/2016 | Rajagopal et al. |
| 9,736,779 | B2 | 8/2017 | Min et al. |
| 2014/0031076 | A1* | 1/2014 | Tang .................. G01R 31/2832 455/550.1 |
| 2016/0315625 | A1* | 10/2016 | Bae ......................... H03L 7/085 |

OTHER PUBLICATIONS

B. Vigraham, J. Kuppambatti, and P. R. Kinget, "Switched-Mode Operational Amplifiers and Their Application to Continuous-Time Filters in Nanoscale CMOS", IEEE Journal of Solid-State Circuits, vol. 49, Dec. 2014, pp. 2758-2772.

Baccour, N. et al., "Radio Link Quality Estimation in Wireless Sensor Networks: A Survey", ACM Transactions on Sensor Networks, vol. 8, Sep. 2012, pp. 1-35.

C. Schlegel, P. Alexander, and S. Roy, "Coded asynchronous CDMA and its efficient detection", IEEE Transactions on Information Theory, vol. 44, Nov. 1998, pp. 2837-2847.

Chatterjee, S. et al., "0.5-V analog circuit techniques and their application in OTA and filter design", in IEEE Journal of Solid-State Circuits, vol. 40, issue 12, Dec. 5, 2005 pp. 2373-2387.

D. K. McCormick, "IEEE Technology Report on Wake-Up Radio: An Application, Market, and Technology Impact Analysis of Low-Power/Low-Latency 802.11 Wireless LAN Interfaces", 802.11ba Battery Life Improvement: IEEE Technology Report on Wake-Up Radio, Nov. 2017, pp. 1-56.

G. Woodward and B. S. Vucetic, "Adaptive detection for DS-CDMA," Proceedings of the IEEE, vol. 86, Jul. 1998, pp. 1413-1434.

Gambini, S. et al., "Sensitivity analysis for AM detectors", Technical Report, Electrical Engineering and Computer Sciences University of California at Berkeley, Apr. 6, 2008, pp. 1-6.

Gantsog et al, "A 12.46uW Baseband Timing Circuitry for Sychronization and Duty-Cycling of Scalable Wireless Mesh Networks in IoT", RFIC, Jun. 2018, pp. 328-331.

Hajimiri, A. et al., "A general theory of phase noise in electrical oscillators," in IEEE Journal of Solid-State Circuits, vol. 33, issue 2, Feb. 1998, pp. 179-194.

Hajimiri, A. et al., "Jitter and phase noise in ring oscillators", in IEEE Journal of Solid-State Circuits, vol. 34, issue 6, Jun. 1999, pp. 790-804.

Hein, J. P. et al., "z-domain model for discrete-time PLL's", in IEEE Transactions on Circuits and Systems, vol. 35, issue 11, Nov. 1988, pp. 1393-1400.

Hsieh, S. "A 0.4-V 13-bit 270-kS/s SAR-ISDM ADC With Opamp-Less Time-Domain Integrator", in IEEE Journal of Solid State Circuits, vol. 54, issue 6, Feb. 14, 2019, pp. 1648-1656.

Huang, X. et al., "Noise and Sensitivity in RF Envelope Detection Receivers", in IEEE Transactions on Circuits and Systems II: Express Briefs, vol. 60, issue 10, Aug. 29, 2013, pp. 637-641.

Jiang et al., "A 4.5nW Wake-up Radio with -69dBm Sensitivity", in the Proceedings of the 2017 IEEE International Solid-State Circuits Conference, San Francisco, CA, Feb. 5-9, 2017, pp. 416-418.

M. Gorlatova et al., "Energy-Harvesting Active Networked Tags (EnHANTs) for ubiquitous Object Networking", IEEE Wireless Communications, vol. 17, No. 6, Dec. 23, 2010, pp. 18-25.

Magno et al., "Design, Implementation, and Performance Evaluation of a Flexible Low-Latency Nanowatt Wake-Up Radio Receiver", in IEEE Transactions on Industrial Infomatics, vol. 12, issue 2, Apr. 2016, pp. 633-644.

Mandal, S. et al., "Low-Power CMOS Rectifier Design for RFID Applications", in IEEE Transactions on Circuits and Systems I: Regular Papers, vol. 54, issue 6, Jun. 11, 2007, pp. 1177-1188.

Moody et al., "A—76dBm 7.4nW Wakeup Radio with Automatic Offset Compensation", in the Proceedings of the 2018 IEEE International Solid Sate Circuits Conference, Feb. 11-15, 2018, pp. 452-454.

Roberts, N.E. et al., "26.8 A 236nW-56.5dBm-sensitivity bluetooth low-energy wakeup receiver with energy harvesting in 65nm CMOS", in 2016 IEEE International Solid-State Circuits Conference, San Francisco, CA, Jan. 31-Feb. 4, 2016, pp. 450-451.

Pandey, J. et al., "A 120µW MICS/ISM-band FSK receiver with a 44µW low-power mode based on injection-locking and 9x frequency multiplication", in 2011 IEEE International Solid-State Circuits Conference,s San Francisco, CA, Feb. 20-24, 2011, pp. 460-462.

Pletcher, N. M. et al., "2GHz 52uW Wake-Up Receiver with -72dBm Sensitivity Using Uncertain-IF Architecture", in the 2008 IEEE International Solid-State Circuits Conference Digest of Technical Papers, San Francisco, CA, Feb. 3-7, 2008, pp. 524-633.

Rabaey, J. M. et al., "PicoRadios for wireless sensor networks: the next challenge in ultra-low power design", in 2002 IEEE International Solid-State Circuits Conference, Digest of Technical Papers, San Francisco, CA, Feb. 7, 2002, pp. 200-201.

S. Patil and Y. Tsividis, "Digital processing of signals produced by voltage-controlled-oscillator-based continuous-time ADCs," in 2016 IEEE International Symposium on Circuits and Systems, May 2016, pp. 1046-1049.

S. Patil et al., "Signal Encoding and Processing in Continuous Time Using a Cascade of Digital Delays", IEEE Transactions on Circuits and Systems I: Regular Papers, vol. 66, Mar. 2019, pp. 1017-1030.

S. Ulukus and R. D. Yates, "User capacity of asynchronous CDMA systems with matched filter receivers and optimum signature sequences", IEEE Transactions on Information Theory, vol. 50, May 2004, pp. 903-909.

Sadagopan et al., "A 365nW-61.5 dBm sensitivity, 1.875 cm22.4 GHz wake-up receiver with rectifier-antenna co-design for passive gain", in the Proceedings of the Radio Frequency Integrated Circuits Symposium, Jun. 2017, pp. 180-183.

Salazar et al., "A—97dBm-sensitivity interferer-resilient 2.4GHz wake-up receiver using dual-IF multi-N-Path architecture in 65nm CMOS" in the Proceedings of the International Solid-State Circuits Conference, Feb. 2015, pp. 242-244.

Schell et al. "A Continuous-Time ADC/DSP/DAC System With No Clock With Activity-Dependent Power Dissipation," Journal of Solid State Circuits, vol. 43, Nov. 2018, pp. 2472-2481.

Schulz, P. et al., "Latency Critical IoT Applications in 5G: Perspective on the Design of Radio Interface and Network Architecture", in IEEE Communications Magazine, vol. 55, issue 2, Feb. 3, 2017 pp. 70-78.

Senderowicz et al., "A 23mW 256-tap 8 MSample/s QPSK matched filter for DS-CDMA cellular telephony using recucling integrator correlators", ISSCC, Feb. 2000, pp. 354-355.

Shibano et al., "Matched filter for DS-CDMA of up to 50 MChip/s based on sample analog signal processing", ISCC, San Francisco, CA, USA, Feb. 1997, pp. 100-101.

Stoopman, M. et al., "Co-Design of a CMOS Rectifier and Small Loop Antenna for Highly Sensitive RF Energy Harvesters", in IEEE Journal of Solid-State Circuits, vol. 49, No. 3, Feb. 13, 2014, pp. 622-634.

Umeda, T., "A 950-MHz rectifier circuit for sensor network tags with 10-m distance", in IEEE Journal of Solid-State Circuits, vol. 41, issue 1, Dec. 27, 2005, pp. 35-41.

W. R. Braun, "PN acquisition and tracking performance in DS/CDMA systems with symbol-length spreading sequences", IEEE Transactions on Communications, vol. 45, Dec. 1997, pp. 1595-1601.

Wang et al., "A 6.1-nW Wake-Up Receiver Achieving—80.5-dBm Sensitivity via a Passive Pseudo-Balun Envelope Detector", IEEE Solid- State Circuits Letters, vol. 1, May 2018, pp. 134-137.

(56) References Cited

OTHER PUBLICATIONS

Wang, P. et al., "A 400 MHz 4.5 nW-63.8 dBm sensitivity wake-up receiver employing an active pseudo-balun envelope detector," in Proceedings of 43rd IEEE European Solid State Circuits Conference, Leuven, Belgium, Sep. 11-14, 2017, pp. 35-38.

Wang, P. et al., "A Near-Zero-Power Wake-Up Receiver Achieving—69-dBm Sensitivity", in IEEE Journal of Solid-State Circuits, vol. 53, No. 6, Apr. 19, 2018, pp. 1640-1652.

Yadav, K. et al., "A 4.4uW wake-up receiver using ultrasound data communications", in 2011 Symposium on VLSI Circuits Digest of Technical Papers, Honolulu, HI, Jun. 15-17, 2011, pp. 212-213.

Ye, D. et al., "A 915 MHz 175 µW Receiver Using Transmitted-Reference and Shifted Limiters for 50 dB In-Band Interference Tolerance", in IEEE Journal of Solid-State Circuits, vol. 51, Issue 12, Sep. 21, 2016, pp. 3114-3124.

Ye, D. et al., "An Ultra-Low-Power receiver using transmitted-reference and shifted limiters for in-band interference resilience", 2016 IEEE International Solid-State Circuits Conference, San Francisco, CA, Jan. 31-Feb. 4, 2016, pp. 438-439.

Yoon, D. et al., "A New Approach to Low-Power and Low-Latency Wake-Up Receiver System for Wireless Sensor Nodes", in IEEE Journal of Solid-State Circuits, vol. 47, issue 10, Aug. 28, 2012, pp. 2405-2419.

\* cited by examiner

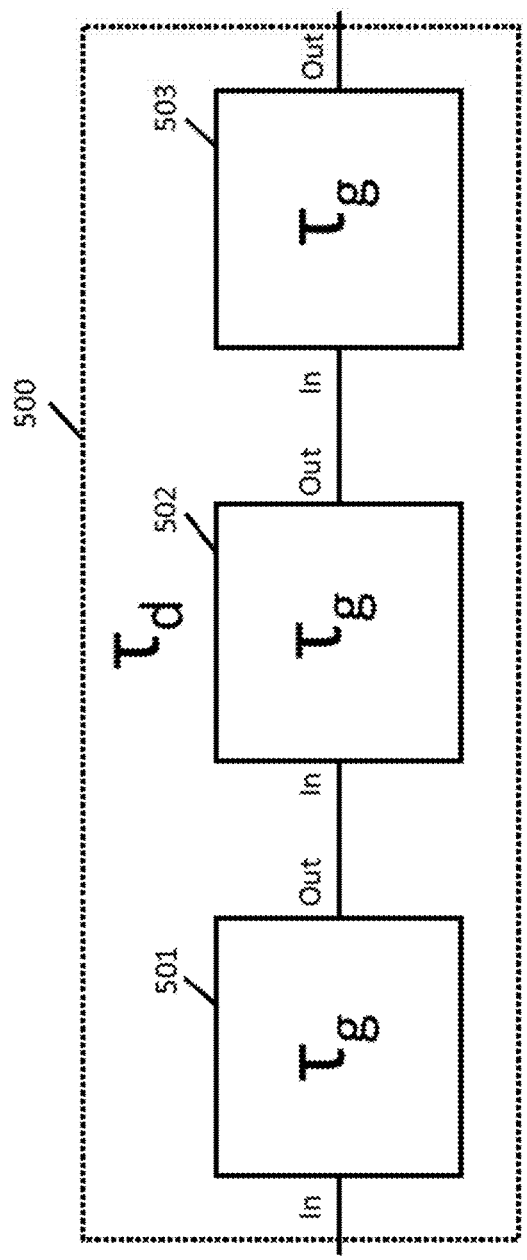

CIRCUITS FOR CONTINUOUS-TIME CLOCKLESS ANALOG CORRELATORS

CROSS REFERENCE TO RELATED APPLICATION

This application claims the benefit of U.S. Provisional Patent Application No. 62/855,853, filed May 31, 2019, which is hereby incorporated by reference herein in its entirety.

STATEMENT REGARDING GOVERNMENT FUNDED RESEARCH

This invention was made with government support under grant 1309721 awarded by the National Science Foundation. The government has certain rights in the invention.

BACKGROUND

Typical IoT wake-up receivers operating with less than 1 μW demodulate a radio-frequency (RF) signal using a non-linear energy detector (ED). This imposes limits on their sensitivity and, their range for a given peak transmit power. Improving range and the receiver's sensitivity requires integrating data pulses for a longer duration of time, and thus decreasing the data-rate of the data-pulses and increasing the latency of the wake-up operation. Typical ED wake-up receivers use On-Off Keying (OOK) modulation and respond to a wake-up code ranging between 10 to 32 bits. Typical ED wake-up receivers use a clocked, digital correlator after a baseband comparator to detect a wake-up code, requiring synchronization with the incoming signal or two-times oversampling. In the presence of in-band, amplitude modulated (AM) interference the frequency-domain selectivity is limited, and the receiver can get blocked.

Accordingly, new circuits for correlators are desirable.

SUMMARY

In accordance with some embodiments, circuits for continuous-time, clockless analog correlators are provided. In some embodiments, circuits for a continuous-time analog correlators are provided, the circuits comprising: a first voltage-controlled oscillator (VCO) that receives an input signal and that outputs a first pulse frequency modulated (PFM) output signal; a second VCO that receives a reference signal and that outputs a second PFM output signal; a first phase frequency detector (PFD) that receives the first PFM output signal and the second PFM output signal and that produces a first PFD output signal; a first delay cell that receives the first PFM output signal and that produces a first delayed signal; a second delay cell that receives the second PFM output signal and that produces a second delayed signal; a second PFD that receives the first delayed signal and the second delayed signal and that produces a second PFD output signal; and a capacitor-digital-to-analog converter (capacitor-DAC) that receives the first PFD output signal and the second PFD output signal and that produces a correlator output.

BRIEF DESCRIPTION OF THE DRAWINGS

FIG. 5A is an example of a sub-delay element including sub-sub-delay elements in accordance with some embodiments.

DETAILED DESCRIPTION

In accordance with some embodiments, continuous-time (CT), clockless analog correlators are provided.

Figure 1A:
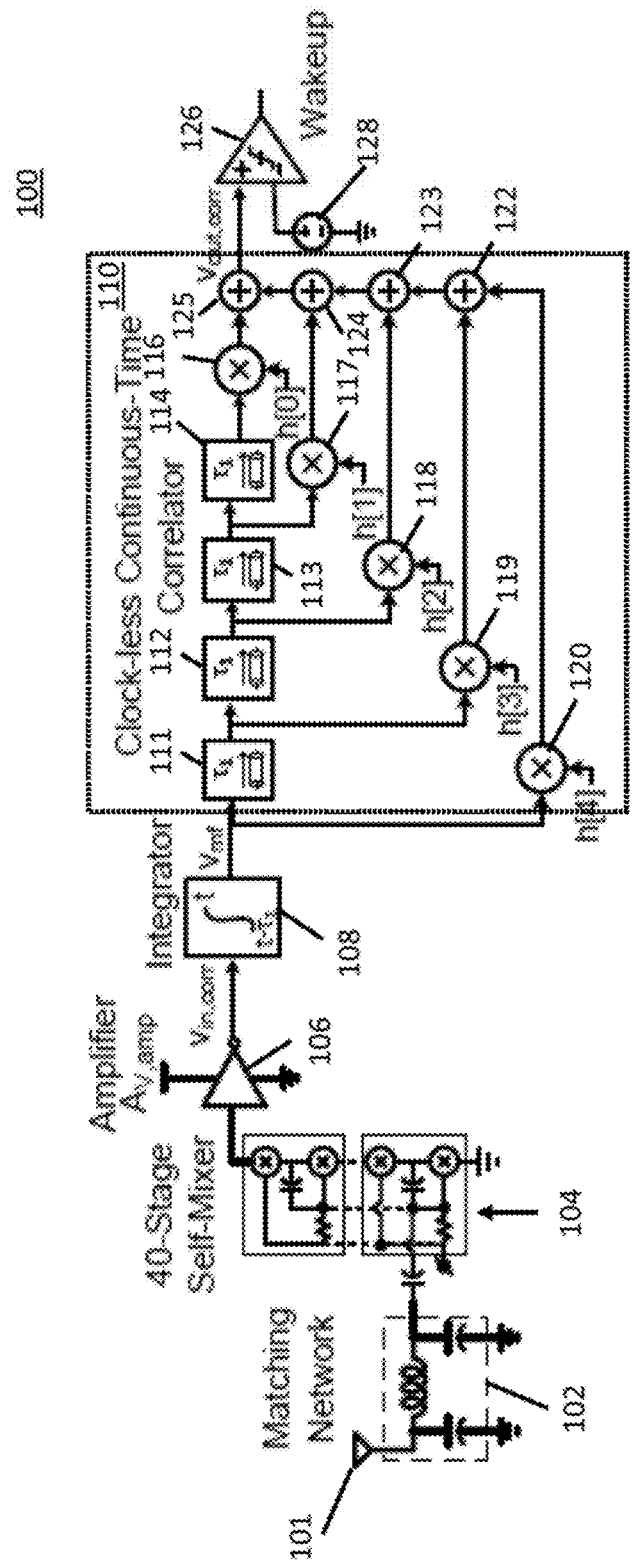
FIG. 1A is an example of a block diagram of a receiver in accordance with some embodiments.

FIG. 1A shows an example 100 of a block diagram of a receiver including a five-bit CT, clockless analog correlator in accordance with some embodiments. As illustrated, this receiver includes an antenna 101, a matching network 102, a 40-stage self-mixer 104, an amplifier 106, an integrator 108, a clock-less, CT correlator 110, a comparator 126, and a threshold reference 128.

During operation, an RF signal received by antenna 101 can be provided to matching network 102, which in turn provides it to self-mixer 104. The self-mixer down converts the signal and provides it to amplifier 106. The amplifier amplifies the signal and provides it to intergrator 108. The integrator integrates the signal over time $t-\tau_1$ to t. The integrated signal then propagates through delay cells 111-114. The outputs of the delay cells are the multiplied by predetermined code bits h[0], h[1], h[2], and h[3] by multipliers 116-119, respectively. The output of the integrator is also multiplied by predetermined code bit h[4] by multiplier 120. The outputs of multipliers 116-120 are added-up by adders 122-125 and then provided to comparator 126. The comparator then compares the output of the adders to a threshold voltage provided by threshold reference 128 to provide a wake-up signal when the output of the adders exceeds the threshold voltage.

In some embodiments, the analog correlator can suppress unwanted codes and thereby provide code-domain selectivity and enable simultaneous wake-up with code-domain multiple access. In some embodiments, a '1', '0' encoded On-Off Keying (OOK) wake-up code can be used (e.g., if all the wake-up receivers use the same code). In some embodiments, for simultaneous wake-up using different wake-up codes, '1' '−1' encoded orthogonal wake-up codes, which can provide better selectivity with respect to unwanted codes, can be used.

Figure 1B:
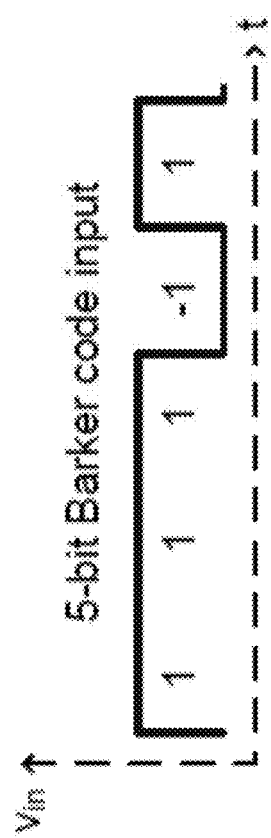
FIG. 1B is an example of a 5-bit Barker code that can be used with the block diagram of FIG. 1A in accordance with some embodiments.
Figure 1C:
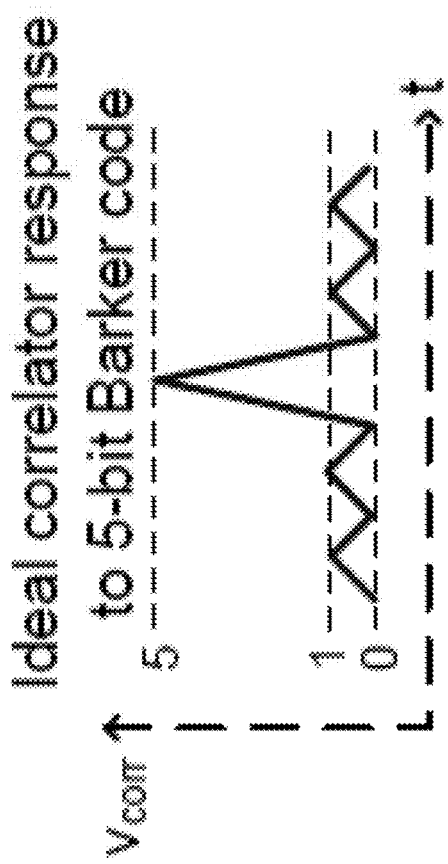
FIG. 1C is an example of an ideal correlator response to the Barker code of FIG. 1B in accordance with some embodiments.

In some embodiments, the correlator can be configured to detect a five-bit (or any other suitable number) code input, such as the Barker code shown in FIG. 1B. When this input is received, an ideal correlator can provide an output as shown in FIG. 1C in accordance with some embodiments.

Additionally, return-to-zero (RZ) encoded symbols can be used in some embodiments so that all desired codes can pass through a DC feedback loop described below.

In accordance with some embodiments, the output, $v_{corr}(t)$, of an ideal n-bit clockless correlator with rectangular bits with a period of $\tau_1$ can be written as:

$$v_{corr}(t) = \int_{\tau=-n\tau_1}^{} v_{in}(t-\tau)h[\tau]d\tau \quad (1)$$

where $v_{in}(t)$ is the input signal and $h[\tau]$ is a piecewise linear function representing the correlation coefficients. $h[\tau]$ is defined for n time periods corresponding to the correlation sequence. Here, the processing gain is $\max(|v_{out,corr}(t)|)/\max(v_{in,corr}(t))$. Assuming the signal uses '1', '−1' On-Off Keying (OOK) encoding, during integration of the signal for N-bits, the signal adds in magnitude while the noise adds in power, thus, the analog correlator provides a processing gain of 10 log(N) for the SNR. Instead, if the signal uses '1', '0' encoding, assuming the number of '1's in the code is L, the corresponding processing gain is 10 log(L).

The output of an ideal correlator for an N-bit sequence given in (1) can be rewritten as:

$$v_{corr}(t) = \sum_{k=1}^{n} \int_{\tau=-k\tau_1}^{(1-k)\tau_1} v_{in}(t-\tau)h[\tau]d\tau \quad (2)$$

$$= \int_{\tau=-\tau_1}^{0} \left( \sum_{k=1}^{n} v_{in}(t-k\tau)h[k\tau] \right) d\tau \quad (3)$$

For an analog signal encoded in time domain, e.g., with pulse-position modulation (PPM) or pulse width modulation (PWM), digital-style delays can be utilized to realize the CT delays in a clockless analog correlator.

Figure 2A:
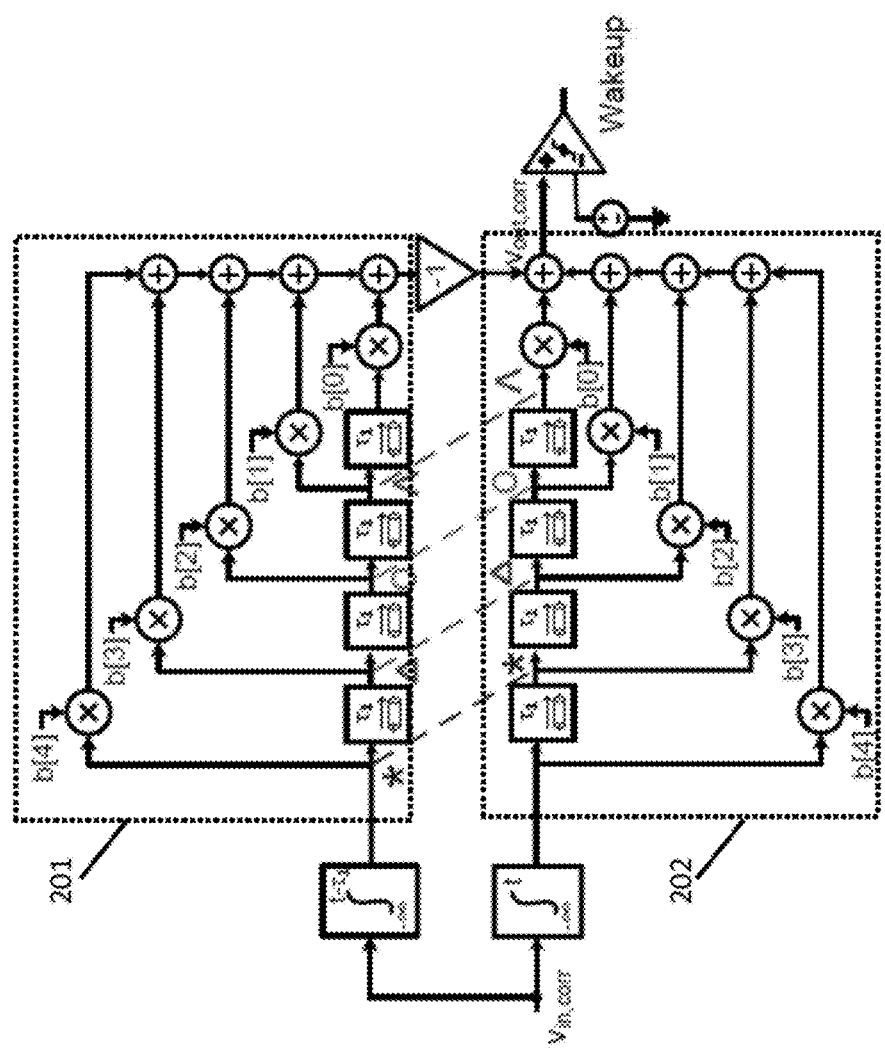
FIG. 2A is an example of a block diagram of a correlator with comparator in accordance with some embodiments.
Figure 2B:
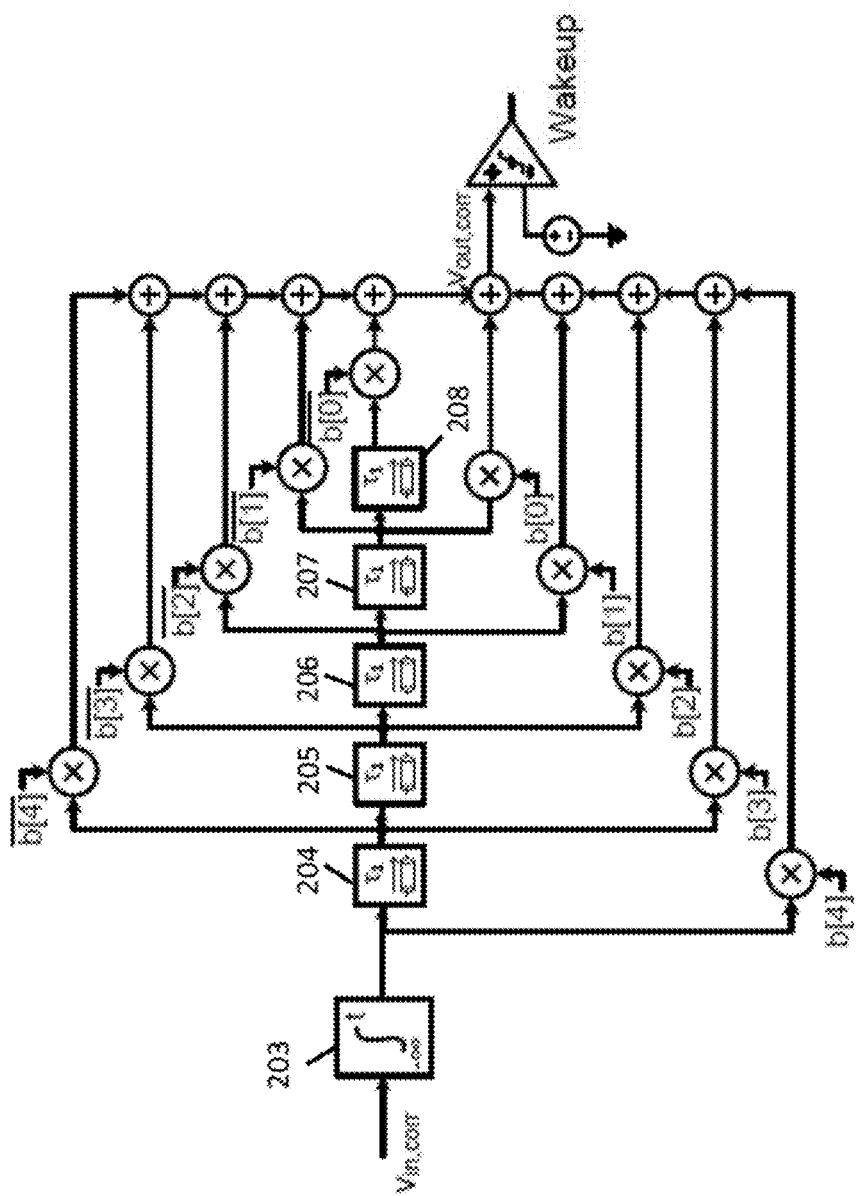
FIG. 2B is an example of a simplified block diagram of a correlator with comparator in accordance with some embodiments.

The ideal analog correlator response (3) can further be written as:

$$v_{out,corr,1}(t) = \quad (4)$$
$$\int_{-\infty}^{0} \sum_{k=1}^{N} v_{in,corr}(t-k\tau)h[k\tau]d\tau - \int_{-\infty}^{-\tau_1} \sum_{k=1}^{N} v_{in,corr}(t-k\tau)h[k\tau]d\tau$$

with the equivalent block diagram in FIG. 2A. Since, the signals in the $\int_{-\infty}^{t-\tau_1}$ branch (top branch 201 shown in FIG. 2A) can be tapped from $\int_{-\infty}^{t}$ branch (bottom branch 202 shown in FIG. 2A) with a delay $\tau_1$ as shown by the dashed lines in FIG. 2A, the much more compact block diagram shown in FIG. 2B can be used in some embodiments. This more compact block diagram can operate as an analog correlator providing the FIR response for the desired code in some embodiments.

In some embodiments: the integration 203 can be implemented using a voltage controlled oscillator (VCO) outputting pulse-frequency modulated (PFM) signals; these signals can easily be delayed using latch-based delays for delays 204-208; and the delayed signals can then be correlated with the code and summed using a capacitor DAC.

Figure 3A:
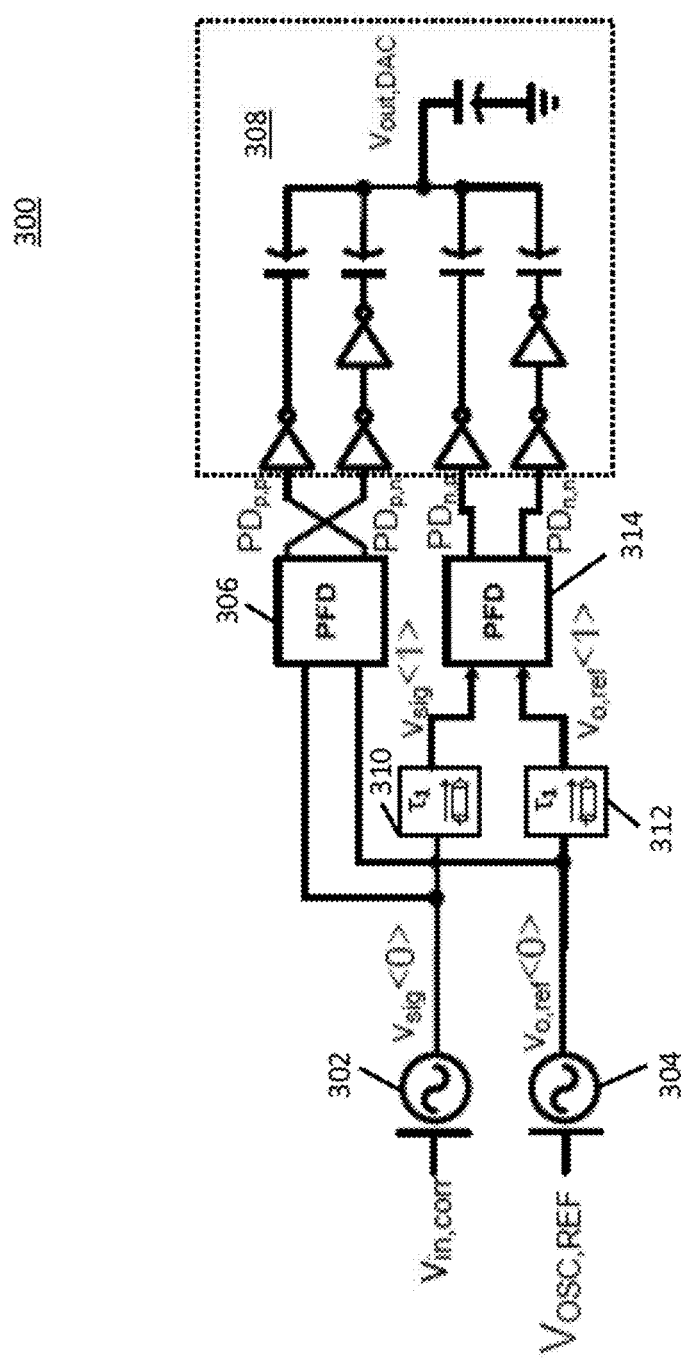
FIG. 3A is an example of 1-bit correlator in accordance with some embodiments.
Figure 3B:
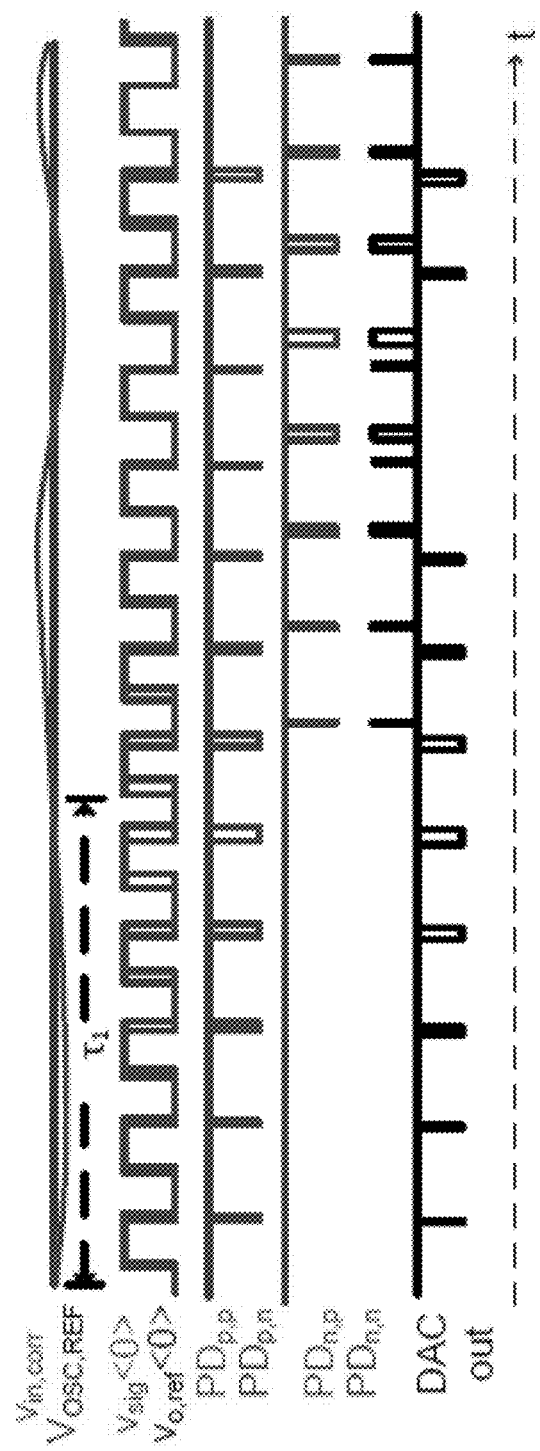
FIG. 3B is an example of a timing diagram of the 1-bit correlator of FIG. 3A in accordance with some embodiments.

For a 1-bit matched filter, (3) can be rewritten as:

$$v_{corr,1}(t) = \int_{-\infty}^{0} v_{in}(t-\tau)h[\tau]d\tau - \int_{-\infty}^{0} v_{in}(t-\tau)h[\tau]d\tau \quad (5)$$

where $h[\tau]$ is 1 or −1 depending on the data-bit being received. FIGS. 3A and 3B show an example of the implementation of a 1-bit matched filter in accordance with some embodiments. As illustrated, the front end of the correlator of FIG. 3A includes two VCOs with a center frequency $f_0$: (1) a signal VCO 302 which converts the input signal, $v_{in,corr}(t)$, into a pulse frequency modulated (PFM) output; and (2) a reference VCO 304 which converts a DC reference $V_{OSC\_REF}$ with frequency $f_0$ into a PFM output. The pulse output positions in $v_{sig}<0>$ relative to the pulse positions in $v_{0,ref}<0>$ provide $$\int_{-\infty}^{t} K_{vco}[(V_{in,corr}(\tau) - V_{OSC\_REF})]d\tau \quad (6)$$

where $K_{vco}$ is the voltage-to-frequency conversion gain of the VCOs. The relative pulse positions are compared with a phase-frequency detector (PFD) 306 and fed to an adder implemented using capacitor-DAC 308 to convert the signal back to voltage domain. This evaluates the first term in (5).

The output pulses of the VCOs are also delayed using latch-based delay cells 310 and 312 with delay $\tau_1$ and the relative position is again evaluated using a PFD 314, thus evaluating the second term in (5).

The output is subtracted using capacitor-DAC 308. This provides a CT windowed integrator response for a window of time $\tau_1$ provided by the delay cell.

Figure 4:
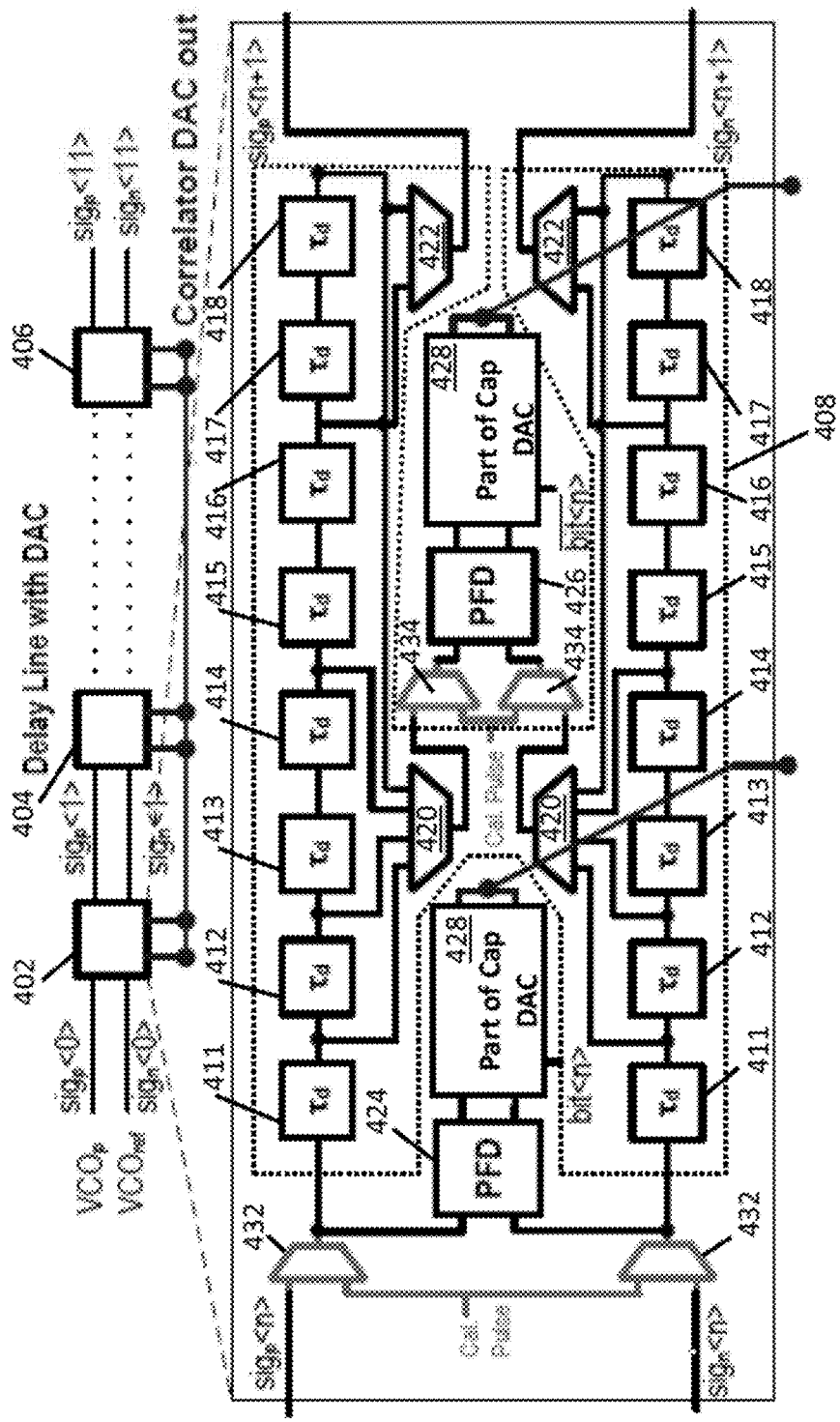
FIG. 4 is an example of delay-PFD-DAC element including sub-delay elements in accordance with some embodiments.
Figure 7A:
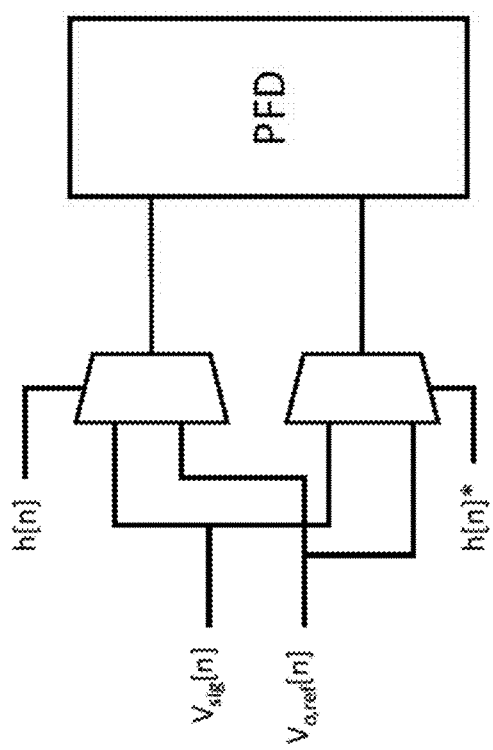
FIG. 7A is an example of a schematic diagram for swapping inputs to a PFD in accordance with some embodiments.
Figure 7B:
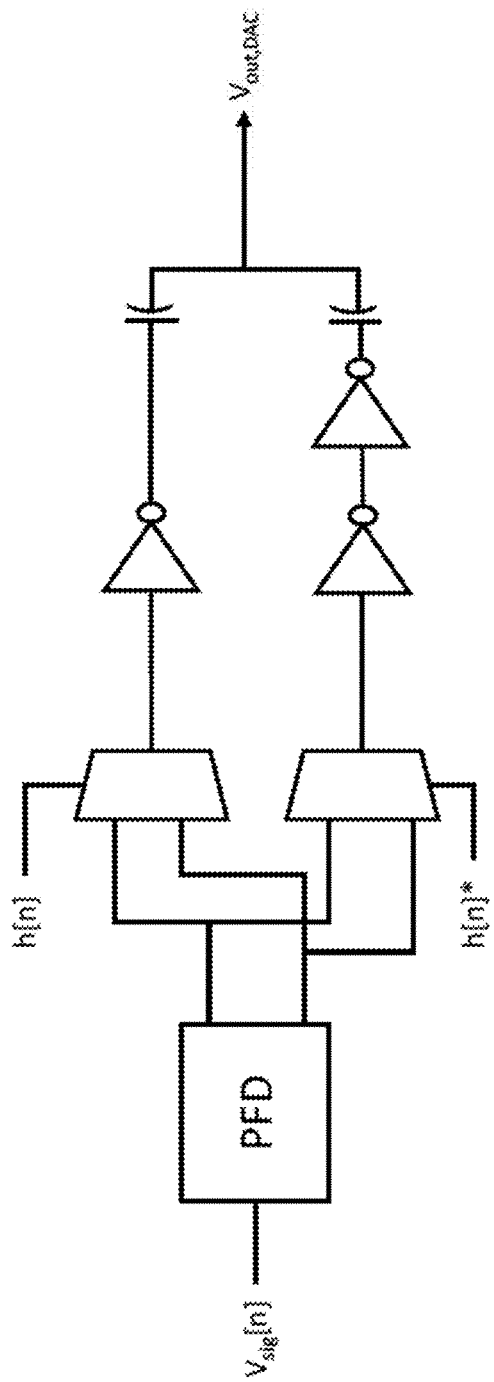
FIG. 7B is an example of a schematic diagram for swapping inputs to a capacitor-DAC in accordance with some embodiments.

As shown in FIG. 4, in some embodiments, N delay-PFD-DAC elements 402, 404, and 406 can be cascaded to keep track of $v_{in}$ for the past $N_{\tau_1}$ duration. As also shown in FIG. 4, in some embodiments, each delay-PFD-DAC element 402, 404, and 406 can include a delay element $\tau_1$ 408 (that includes eight (or any other suitable number) $\tau_d$ delay cells 411-418 cascaded in series and two multiplexers 420 and 422 (for each side of a differential signal as shown in FIG. 4, in some embodiments)), PFDs 424 and 426 to evaluate relative position of pulses, and parts of capacitor-DAC 428 to convert the signal back to the voltage domain. A weighted sum can performed using the capacitor-DACs with weights as the {−1,+1} correlator coefficients $h[\tau]$, implemented by swapping the input signals to the PFDs. This can be performed in any suitable manner, such as by using multiplexers as shown in FIG. 7A, in some embodiments. Alternatively, in some embodiments, each part of the capacitor-DAC can be weighted by a corresponding correlator coefficient $h[\tau]$ by swapping the input signals to the part of the capacitor-DAC. This can be performed in any suitable manner, such as by using multiplexers as shown in FIG. 7B, in some embodiments. Eleven such delay-PFD-DAC elements can be connected in series and the outputs of the DACs can be connected together to evaluate the correlator output $v_{corr}(t)$ in some embodiments.

Multiplexers 420 and 422 can be used to select different delays for delay element $\tau_1$ 408 in some embodiments. These multiplexers can be controlled in any suitable manner in some embodiments. For example, these multiplexers can be controlled by a hardware processor (not shown) that oversees the operation of a receiver including an analog correlator incorporating elements 402, 404, and/or 406, in some embodiments.

Calibration multiplexers 432 and 434 can be provided in some embodiments to facilitate injecting calibration pulses into elements 402, 404, and/or 406. An example of the calibration operation is described further below in connection with FIGS. 8A and 8B in some embodiments.

Figure 5B:
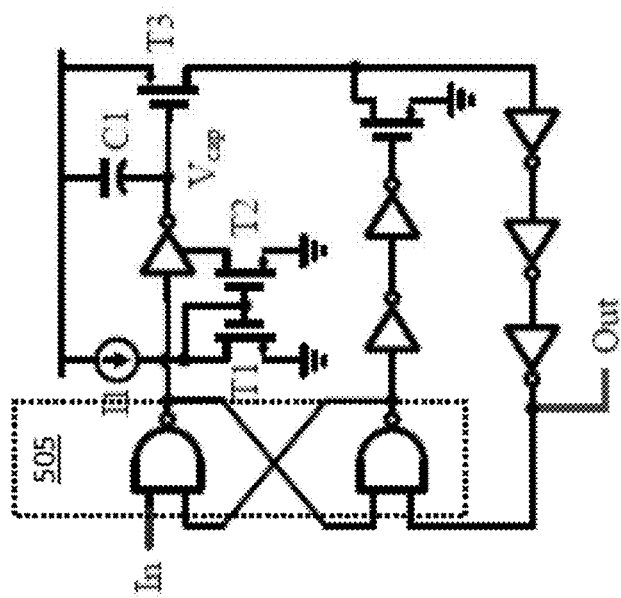
FIG. 5B is an example of a schematic for a sub-sub-delay element in accordance with some embodiments.

In some embodiments, as shown in FIG. 5A, each delay element $\tau_d$ 500 can include three (or any other suitable number) $\tau_g$ delay cells 501, 502, and 503, each as shown in FIG. 5B. These $\tau_g$ delay cells can be cascaded by connecting the "Out" signals of the first and second $\tau_g$ delay cells 501 and 502 to the "In" of the second and third $\tau_g$ delay cells 502 and 503, respectively.

Figure 5C:
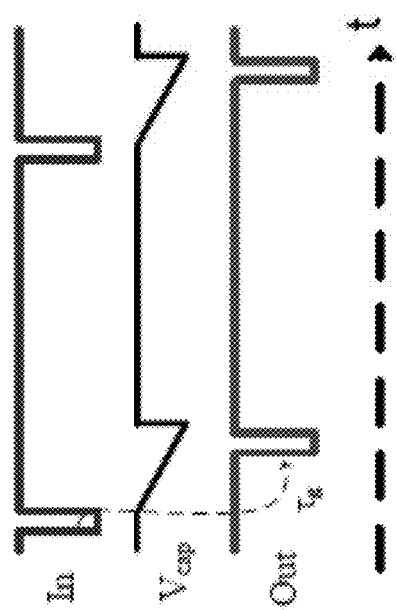
FIG. 5C is an example of a timing diagram for a sub-sub-delay element in accordance with some embodiments.

As shown in FIGS. 5B and 5C, an input falling edge at "In" sets SR latch 505 to discharge C1, until it reaches a threshold to turn T3 on. Once T3 is triggered, it delivers a falling edge pulse at the output "Out" and resets the latch. The delay $\tau_g$ is controlled by current source I1, current mirror T1 and T2, MIM-cap C1, and the T3 threshold. Variations in transistors can be controlled using current mirror trimming, in some embodiments. For example, in some embodiments, six bits can be used to trim the current mirror T1 and T2. This can be done in any suitable manner, such as by including a set of six parallel transistors (one for each bit) in series with different fingers of T2 and properly sized to allow different amounts of current to flow through T2 based on the values of the bits.

In some embodiments, current source I1 can be mirrored from an 8 pA (or any other suitable size) core current mirror 608 having 6-bit (or any other suitable number) trim to provide a 30% (or any other suitable number) tuning range to compensate for current mirror and delay cell mismatches. In some embodiments, the core current mirror can also have a 50% (or any other suitable number) tuning range to set the average delay and compensate for process variations. The delay cell calibration can be used to set the delays in some embodiments.

In some embodiments, the minimum pulse width ($\tau_{pulse}$) required for the input pulse is decided by the setup time of SR latch 502. The maximum pulse width should be less than the delay of the unit cell, in some embodiments. Therefore, in some embodiments, the input-pulse instantaneous frequency must be less than $(1/(\tau_g+\tau_{pulse}))$. For $\tau_1$=10 msec, $\tau_g$=10,000 μsec/24=416 μsec. This leads to a maximum input-pulse frequency of 2.3 kHz in some embodiments. Due to the variations in the current mirrors controlling the delay cells and the added jitter, the operating frequency of the reference VCO can be set to 1.1 kHz in some embodiments.

Figure 6:
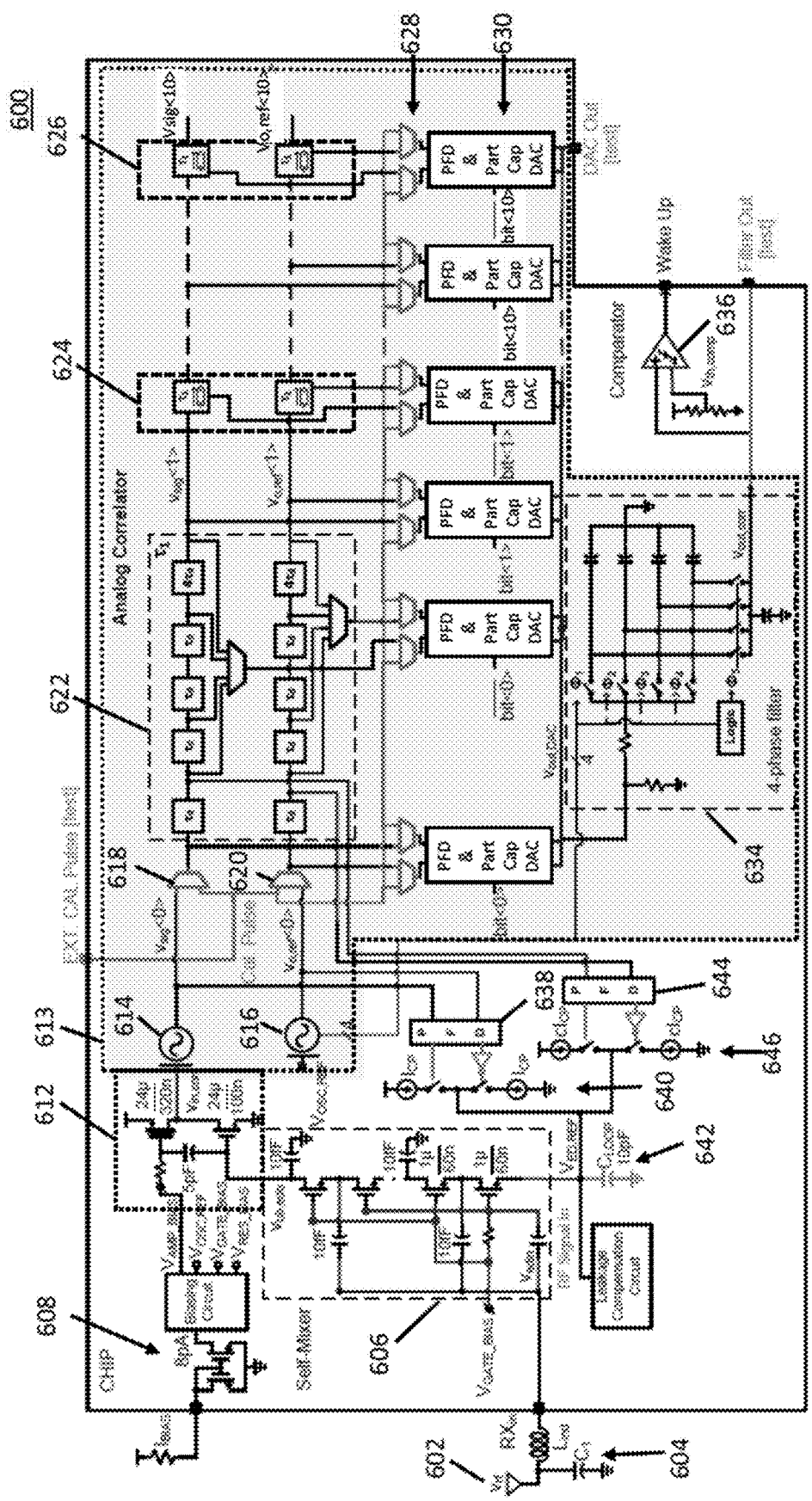
FIG. 6 is an example of a schematic of a receiver in accordance with some embodiments.

FIG. 6 shows an example 600 of a wake-up receiver using an analog correlator for code-domain matched filtering in accordance with some embodiments. In some embodiments, this receiver can be targeted to operate in 434 MHz ISM band, use an 11-bit wake-up code at a data rate of 100 bps.

As shown, the RF front end includes a matching network 604 connected to an antenna 602 at its input and a self-mixer 606 at its output. The matching network matches the impedance of self-mixer 606 to antenna 602. Any suitable matching network can be used in some embodiments. For example, in some embodiments, the matching network can match the impedance of self-mixer 606 to antenna 602 at 450.8 MHz. More particularly, for example, in some embodiments, matching network 604 can include a 132-10SM inductor $L_{ind}$=111 nH available from COILCRAFT of Cary, Ill. and a capacitor $C_1$=14 pF.

Self-mixer 606 can receive the signal output by matching network 604. Any suitable self-mixer can be used in some embodiments. For example, a 40-stage gate-biased energy detector (ED) with an input resistance of 200 kΩ can be used as self-mixer 606.

The output of self-mixer 606 is amplified using amplifier 612. Any suitable amplifier can be used in some embodiments. For example, in some embodiments, a one-stage current-reuse amplifier can be used as amplifier 612. As a more particular example, in some embodiments, the amplifier can be a current-reuse baseband inverting amplifier with a gain ($A_{v,amp}$) of 26 dB and a 1 dB baseband noise figure relative to the noise contributed by the self-mixer. A PMOS transistor in the amplifier (as shown in FIG. 6) can be current biased using a current mirror with AC coupling while an NMOS transistor in the amplifier (as shown in FIG. 6) can be biased through a DC feedback loop including PFDs 638 and 644 and charge pumps 640 and 646.

The output of amplifier 612 is provided to CT, clockless analog correlator 613. In some embodiments, correlator 613 can include VCOs 614 and 616 that integrate and encode the input signal into a pulse-position modulated (PPM) signal, delay lines 622, 624, and 626, PFD 630, and parts of capacitor-DAC 632 that correlate received pulses with the desired code, and a 4-phase filter 634 that suppresses the VCO frequency and its harmonics.

In some embodiments, VCOs 614 and 616 can be implemented using 4-phase current-starved ring oscillators operating at 1.1 kHz with conversion gain $K_{vco}$=25 kHz/V. As described below, the average frequency of signal VCO 614 can be locked to $f_0$ using a PLL. This sets the DC potential at $v_{in,corr}$ equal to $V_{OSC,REF}$.

At the input and the output of each delay element $\tau_1$ 622, 624, and 626, a PFD 630 is used to evaluate the relative position of pulses. The outputs of the twenty-two PFDs 630 are sent to the corresponding parts of capacitor-DAC 632 to implement eleven matched filters for an 11-bit code. A weighted sum can performed using the capacitor-DACs with weights as the {−1,+1} correlator coefficients h[τ], implemented by swapping the input signals to the PFDs. This can be performed in any suitable manner, such as by using multiplexers as shown in FIG. 7A, in some embodiments. Alternatively, in some embodiments, each part of the capacitor-DAC can be weighted by a corresponding correlator coefficient h[τ] by swapping the input signals to the part of the capacitor-DAC. This can be performed in any suitable manner, such as by using multiplexers as shown in FIG. 7B, in some embodiments. The weighted sum provides the output of correlator 613.

In some embodiments, the output of correlator 613 can have strong signal components at $f_0$ and its harmonics that need to be filtered out. These strong signal components and harmonics can be filtered out using a 4-phase filter 634 in some embodiments. 4-phase filter 634 uses the 4-phases of the reference VCO to sample the correlator output and averages the output over one VCO period to suppress the outputs at $f_{VCO}$ and its harmonics. Four phases $\varphi_{1-4}$ of the $f_0$ with 20% duty-cycle can be used to sample the signal at the output of the correlator. A series resistor is used to provide a low-pass frequency response, a nonoverlapping phase $\varphi_5$ with 5% duty-cycle is used to average the four samples.

In some embodiments, on average, the frequency of signal VCO 614 needs to be locked to the frequency of reference VCO 616 for glitch-free operation of the correlator. In some embodiments, this can be ensured using a phase locked loop (PLL). In order to do so, in some embodiments, the outputs of the VCOs can be compared with PFD 638 and fed to a charge pump (CP) 640 with current $I_{CP}$ that drives a 10 pF capacitor $C_{LOOP}$ 642. The feedback loop has two poles at DC, and needs to be compensated to achieve stability. The VCO outputs delayed by $\tau_d$ can also drive a second PFD 644 with the inputs swapped for sign inversion. The Up/Down pulses from the second PFD drive a second charge pump 646 connected to $C_{LOOP}$ 642 with a current $cI_{CP}$, where c is a scaling constant 0<=c<=1. This introduces a zero, and stabilizes the loop. In some embodiments, this PLL additionally provides a high-pass response in the signal path and rejects the low-frequency flicker noise added by the amplifier.

The output of the correlator is fed to a comparator 636 that decides if the receiver should wake up. Any suitable comparator can be used in some embodiments. For example, in some embodiments, a dynamic latched comparator clocked at frequency $f_0$ from the reference VCO can be used to compare the correlator output to detect the wake-up signal.

In some embodiments, a data rate of 100 bps can be used. Hence, a bit period $\tau_1$ can be 10 ms, and a required false-alarm rate <=1/h and an MDR <=$10^{-3}$. This is equivalent to a receiver with a sampling rate of $f_s=1/\tau_1$. Since there are (3600·$f_s$) samples in an hour, the probability of a comparator being triggered due to noise P(1|0) has to be <=1/(3600·$f_s$). If the RMS noise measured at $v_{out,corr}$ is $\sigma$=3.4 mVrms, the required comparator threshold is then 4.6$\sigma$ (16 mV) where $\sigma$ is the root-mean square (RMS) noise at the correlator output for a false alarm rate less than one per hour. The signal needs to be 3.1$\sigma$ above the threshold (i.e., total 7.7$\sigma$) for successful detection with an MDR <=$10^{-3}$. The required SNR at the correlator output is thus 17.7 dB in some embodiments.

In some embodiments, a threshold of 20 mV can be used to provide tolerance to glitches. In some embodiments, the comparator can be PMOS triggered with mismatched transistor sizes for a negative threshold of −20 mV.

In accordance with some embodiments, a '1' and '−1' encoded On-Off Keying (OOK) symbol can be realized by transmitting peak or no power respectively, while transmitting symbol '0' with half the power when no symbol is being transmitted. This can ensure a linear voltage at the self-mixer output, in some embodiments. During the vast majority of the time that the receiver is expected to receive no data, a corresponding transmitter can be configured to not transmit and the receiver will observe a '0'. In some embodiments, when the transmitter transmits a wake-up code, the DC feedback loop will provide high pass filtering at baseband, the receiver will adjust its '0' level to transmitter half-power. A preamble with half-power can be used in some embodiments to provide appropriate settling time for the DC feedback loop. For example, in some embodiments, for a DC-feedback-loop settling time of 25 ms, the preamble may be required to be 2.5-bits. This leads to an additional 25 ms latency compared to a '1' '0' encoding, in some embodiments.

Figure 8A:
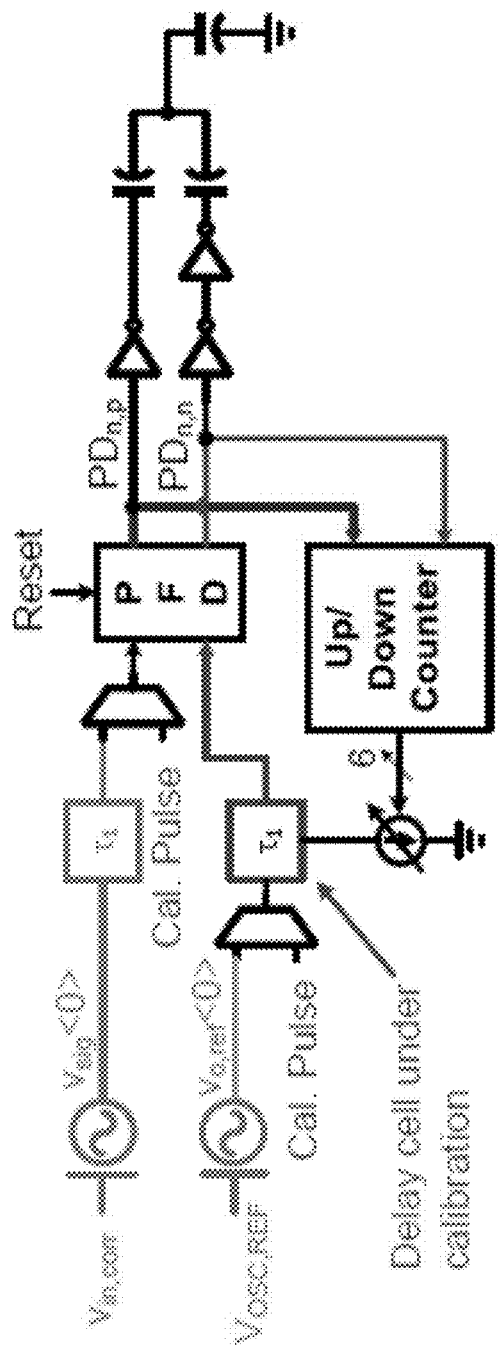
FIG. 8A is an example of a process for calibrating a delay cell in accordance with some embodiments.
Figure 8B:
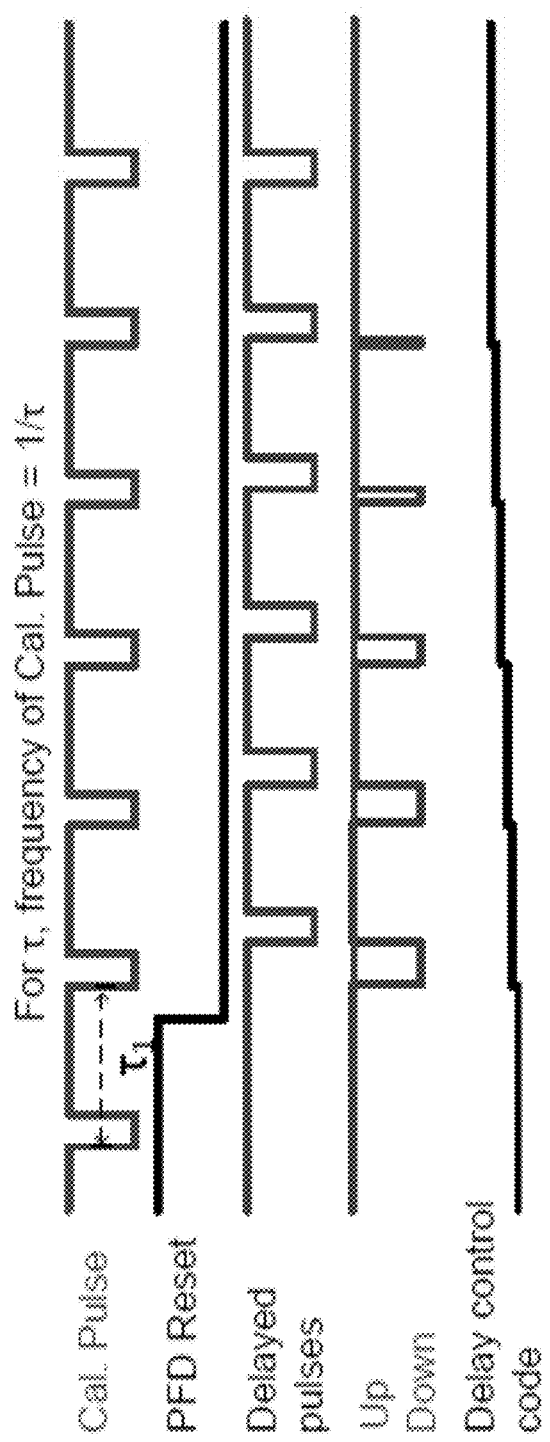
FIG. 8B is an example of a timing diagram for calibrating a delay cell in accordance with some embodiments.

As mentioned above, in some embodiments, all delay cells can be controlled by a core current source which has a 6-bit trim setting to account for process variations. Calibrating the mismatch between the delay cells can be used in some embodiments to avoid cycle slipping and enable operation at maximum dynamic range. In some embodiments, each delay element $\tau1$ can include a 6-bit trimming register to account for these mismatches. An example calibration process to set the delays is shown in FIGS. 8A and 8B. For example, in some embodiments, to calibrate a $\tau_1$ delay cell in the reference delay line, the VCO output can be bypassed using multiplexer 620 and falling edge pulses (Cal_Pulses) with frequency 1/($\tau_1$) can be fed at the input of the delay cell. The corresponding delay element in the signal delay line can be bypassed using multiplexer 628 and Cal_Pulses can be fed to the PFD. Thus, the PFD at the output of the delay cells can compare $\tau_1$ to the period of the Cal_Pulses. Up/Down pulses provide feedback to increase/decrease the delay control code to set the delay. In some embodiments, calibration is required for all eleven $\tau_1$ delay cells. In some embodiments, to reduce the need for calibration, the device sizes can be increased to reduce mismatch, however, this may lead to an increase in power consumption.

In some embodiments, to tolerate higher drift in delays, either a temperature compensated oscillator on-chip or a crystal reference can be used. During large temperature changes, these can be turned on as a reference for re-calibration of the delay cells.

In some embodiments, the outputs of the PFDs may saturate with increasing input signal strength due to the limited maximum pulse position difference which is limited to the VCO period 1/$f_0$. At higher input signal strength, the frequency variations on the VCOs can be large which leads to cycle slipping and the bits to show a +/−correlation, which leads to a non-monotonic processing gain degradation. In some embodiments, adaptive gain control techniques can be used to increase the dynamic range further.

In some embodiments, UP/Down counters at the output of the PFDs that are controlled by the states in the PFD can be used to enable multi-level digital output and to further enhance the dynamic range.

In some embodiments and instances, a receiver can issue a false wake-up in the presence of a short burst of interference. Assuming that the self-mixer response to a bursty AM interferer is an impulse, the output of the correlator can be its impulse response which is exactly the code it is configured for. In some embodiments, finite state machines can be used to detect such code and prevent a false wake-up.

In some embodiments, preamble sampling or bit-level duty cycling can be used with RF front-end amplifiers to achieve better sensitivity at the cost of relatively higher power consumption for similar latency.

As described above, in some embodiments, continuous-time (CT), clockless analog correlators can be located in a receiver before the receiver's baseband comparator and can perform matched filtering (MF). In some embodiments, continuous-time (CT), clockless analog correlators eliminate the synchronization challenges experienced by digital correlators and can provide an improved output signal-to-noise ratio (SNR), and thus sensitivity, with the same data rate and latency compared to digital correlators. In some embodiments, continuous-time (CT), clockless analog correlators can provide code-domain filtering for enhanced selectivity and suppress AM interference. The wake-up codes can be treated as direct sequence code-division multiple-access (DS-CDMA) signals in some embodiments. Using direct sequence code-division multiple access (DS-CDMA) can allow for simultaneous wake-up of different receivers each programmed to wake-up with its own unique code in some embodiments. The code-domain filtering offered by analog correlators enables the wake-up receivers to detect their code while other unwanted codes get suppressed even when used in the same time slot in some embodiments.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for a continuous-time analog correlator, comprising:
   a first voltage-controlled oscillator (VCO) that receives an input signal and that outputs a first pulse frequency modulated (PFM) output signal;
   a second VCO that receives a reference signal and that outputs a second PFM output signal;
   a first phase frequency detector (PFD) that receives the first PFM output signal and the second PFM output signal and that produces a first PFD output signal;
   a first delay cell that receives the first PFM output signal and that produces a first delayed signal;
   a second delay cell that receives the second PFM output signal and that produces a second delayed signal;
   a second PFD that receives the first delayed signal and the second delayed signal and that produces a second PFD output signal; and
   a capacitor-digital-to-analog converter (capacitor-DAC) that receives the first PFD output signal and the second PFD output signal and that produces a correlator output.

2. The circuit of claim 1, wherein: the first PFD has a first input and a second input; for a first value of a desired code bit, the first PFD receives the first PFM output signal at the first input and receives the second PFM output signal at the second input; and for a second value of the desired code bit, the first PFD receives the first PFM output signal at the second input and receives the second PFM output signal at the first input.

3. The circuit of claim 2, further comprising two multiplexers that cause the first PFD to receive the first PFM output signal at the first input and to receive the second PFM output signal at the second input for the first value of the desired code bit, and that cause the first PFD to receive the first PFM output signal at the second input and to receive the second PFM output signal at the first input for the second value of the desired code bit.

4. The circuit of claim 1, wherein: the capacitor-DAC has a first input and a second input; the PFD has a first PFD output and a second PFD output; for a first value of a desired code bit, the capacitor-DAC receives an output of the first PFD output at the first input and receives an output of the second PFD output at the second input; and for a second value of the desired code bit, the capacitor-DAC receives the output of the first PFD output at the second input and receives the output of the second PFD output at the first input.

5. The circuit of claim 4, further comprising two multiplexers that cause the capacitor-DAC to: receive the output of the first PFD output at the first input and receive the output of the second PFD output at the second input for the first value of the desired code bit; and receive the output of the first PFD output at the second input and receive the output of the second PFD output at the first input for the second value of the desired code bit.

6. The circuit of claim 1, wherein the continuous-time analog correlator is included in a receiver and the receiver wakes up based on the correlator output.

7. The circuit of claim 6, wherein the receiver comprises a comparator and the comparator wakes up the receiver based on a comparison of the correlator output to a threshold voltage.

8. The circuit of claim 7, further comprising a filter between the correlator output and the comparator.

9. The circuit of claim 8, wherein the filter is a four-phase filter.

10. The circuit of claim 1, wherein the capacitor-DAC includes a plurality of inverters and a plurality of capacitors.

11. The circuit of claim 1, wherein the first delay cell is formed from a plurality of sub-delay cells.

12. The circuit of claim 11, wherein each of the plurality of sub-delay cells is formed from a plurality of sub-sub-delay cells.

13. The circuit of claim 12, wherein each of the plurality of sub-sub-delay cells includes a set-reset latch, a current mirror, and capacitor, and a transistor.

14. The circuit of claim 1, wherein first delay cell includes a set-reset latch, a current mirror, and capacitor, and a transistor.

15. The circuit of claim 1, further comprising:
   a third PFD that receives the first PFM output signal and the second PFM output signal and that produces a third PFD output signal; and
   a first charge pump that receives the third PFD output signal and that controls the input signal.

16. The circuit of claim 15, further comprising:
   a fourth PFD that receives the first delayed signal and the second delayed signal and that produces a fourth PFD output signal; and
   a second charge pump that receives the fourth PFD output signal and that also controls the input signal.

17. The circuit of claim 1, further comprising:
   a fifth PFD that receives the first delayed signal and the second delayed signal and that produces a fifth PFD output signal;
   a third delay cell that receives the first delayed signal and that produces a third delayed signal;
   a fourth delay cell that receives the second delayed signal and that produces a fourth delayed signal; and
   a sixth PFD that receives the third delayed signal and the fourth delayed signal and that produces a sixth PFD output signal,
   wherein the capacitor-DAC also receives the fifth PFD output signal and the sixth PFD output signal.

18. The circuit of claim 1, further comprising:
   a fifth PFD that receives a fifth delayed signal from the first delay cell, wherein the fifth delayed signal is different from the first delayed signal, that receives a sixth delayed signal from the second delay cell, wherein the sixth delayed signal is different from the second delayed signal, and that produces a fifth PFD output signal;
   a third delay cell that receives the fifth delayed signal and that produces a third delayed signal;
   a fourth delay cell that receives the sixth delayed signal and that produces a fourth delayed signal; and
   a sixth PFD that receives the third delayed signal and the fourth delayed signal and that produces a sixth PFD output signal, wherein the capacitor-DAC also receives the fifth PFD output signal and the sixth PFD output signal.

* * * * *